US010515812B1

(12) United States Patent
Wang et al.

(10) Patent No.: US 10,515,812 B1
(45) Date of Patent: Dec. 24, 2019

(54) METHODS OF REDUCING PATTERN ROUGHNESS IN SEMICONDUCTOR FABRICATION

(71) Applicant: Taiwan Semiconductor Manufacturing Co., Ltd., Hsin-Chu (TW)

(72) Inventors: Chien-Wei Wang, Hsinchu County (TW); Joy Cheng, Taoyuan (TW); Ching-Yu Chang, Yilang County (TW); Chin-Hsiang Lin, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/102,347

(22) Filed: Aug. 13, 2018

(51) Int. Cl.
*H01L 21/00* (2006.01)
*H01L 21/288* (2006.01)
*H01L 21/3213* (2006.01)

(52) U.S. Cl.
CPC .... *H01L 21/2885* (2013.01); *H01L 21/32139* (2013.01)

(58) Field of Classification Search
None
See application file for complete search history.

(56) References Cited

U.S. PATENT DOCUMENTS

| 2008/0045022 A1* | 2/2008 | Kurihara | H01L 21/0273 438/694 |
| 2016/0011515 A1* | 1/2016 | Xie | G03F 7/26 430/322 |
| 2016/0109813 A1* | 4/2016 | Nam | G03F 7/40 355/27 |
| 2016/0299435 A1* | 10/2016 | Ouyang | G03F 7/168 |
| 2016/0357107 A1* | 12/2016 | Buchberger, Jr. | G03F 7/0045 |
| 2017/0184976 A1* | 6/2017 | Ouyang | G03F 7/38 |
| 2018/0107117 A1* | 4/2018 | Ouyang | G03F 7/203 |

OTHER PUBLICATIONS

David C Miller et al., "Relation Between Morphology, Etch Rate, Surface Wetting, and Electrochemical Characteristics for Micromachined Silicon Subject to Galvanic Corrosion," Journal of the Electrochemical Society, 155 (12) F253-F265 (2008).

* cited by examiner

*Primary Examiner* — Evren Seven
(74) *Attorney, Agent, or Firm* — Haynes and Boone, LLP

(57) ABSTRACT

A method includes forming a metal-containing material layer over a substrate, patterning the metal-containing material layer, where the patterned material layer has an average roughness, and electrochemically treating the patterned metal-containing material layer to reduce the average roughness. The treatment may be implemented by exposing the patterned metal-containing material layer to an electrically conducting solution, and applying a potential between the patterned material layer and a counter electrode exposed to the solution, such that the treating reduces the average roughness of the patterned material layer. The electrically conducting solution may include an ionic compound dissolved in water, alcohol, and/or a surfactant.

20 Claims, 10 Drawing Sheets

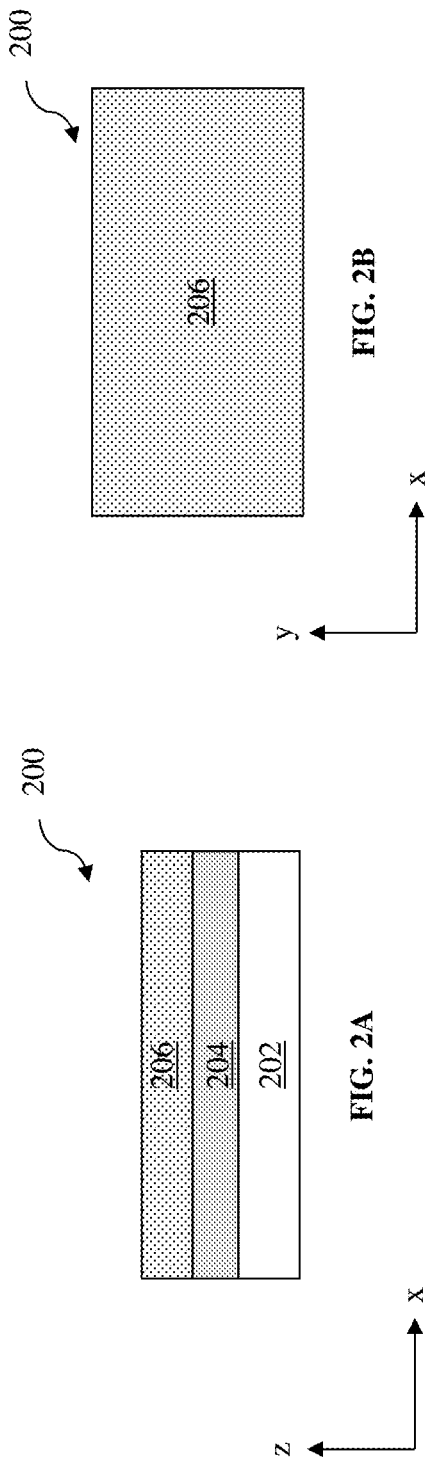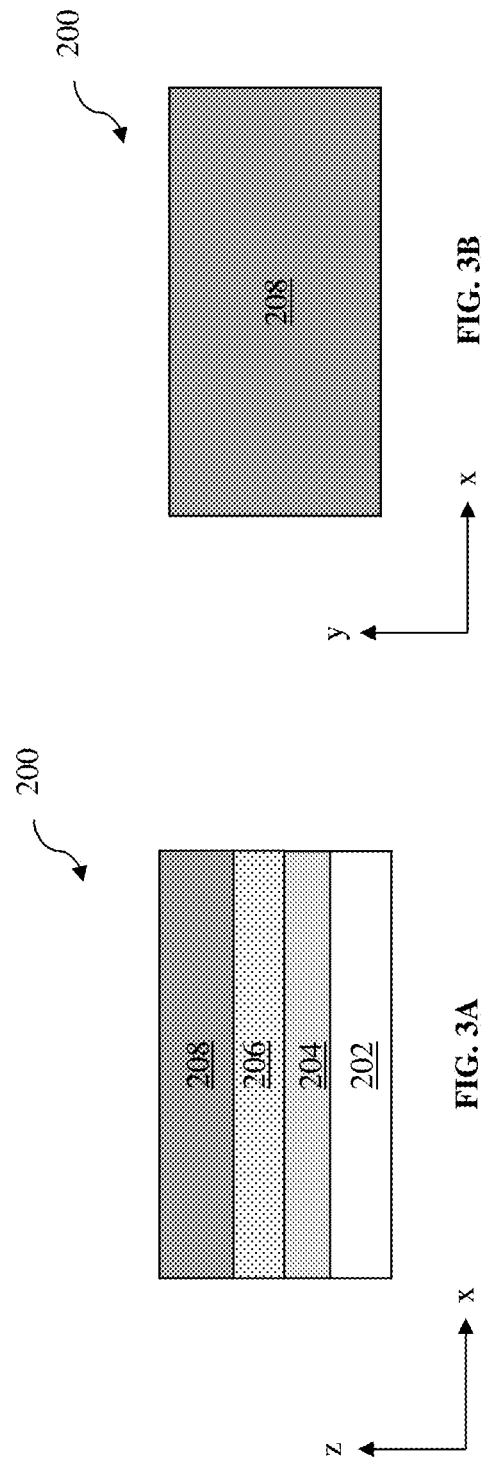

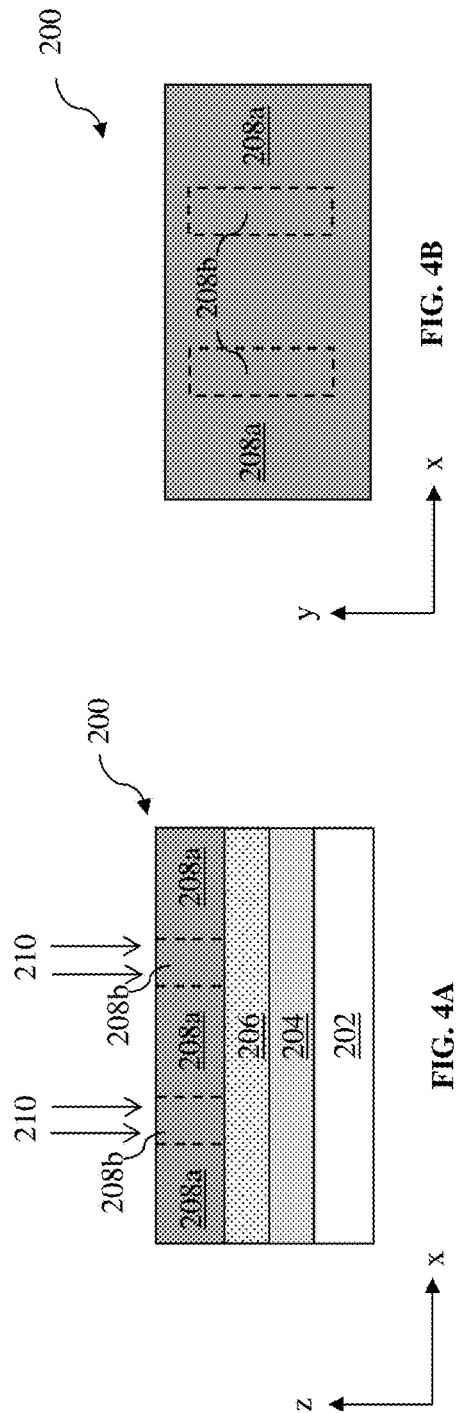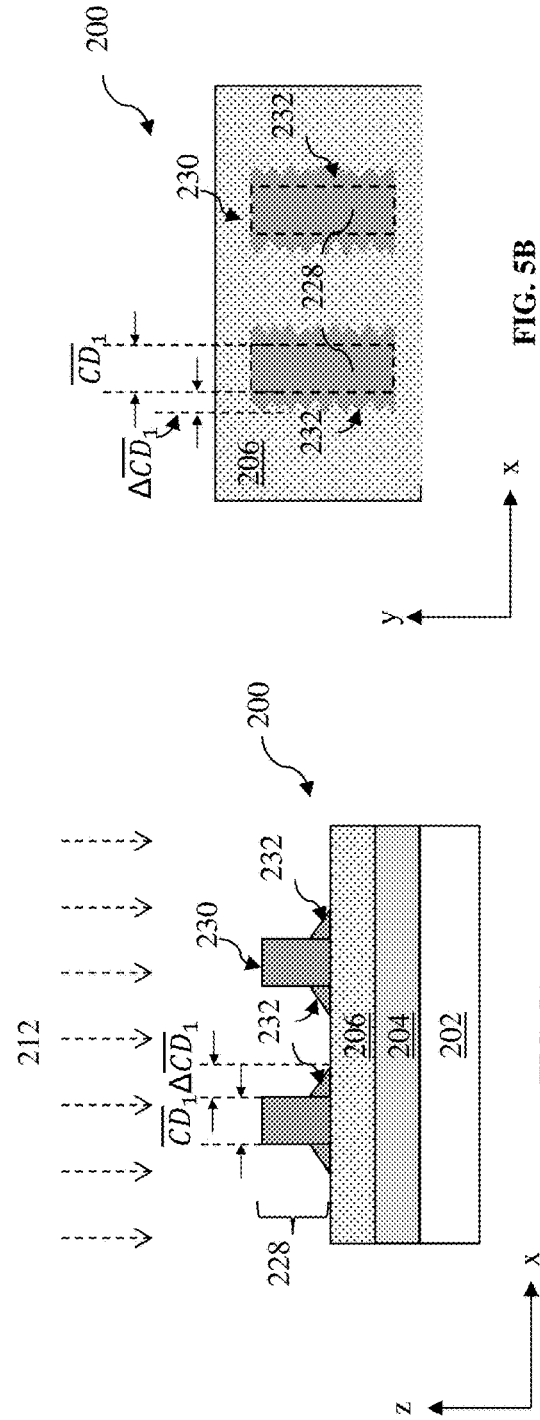

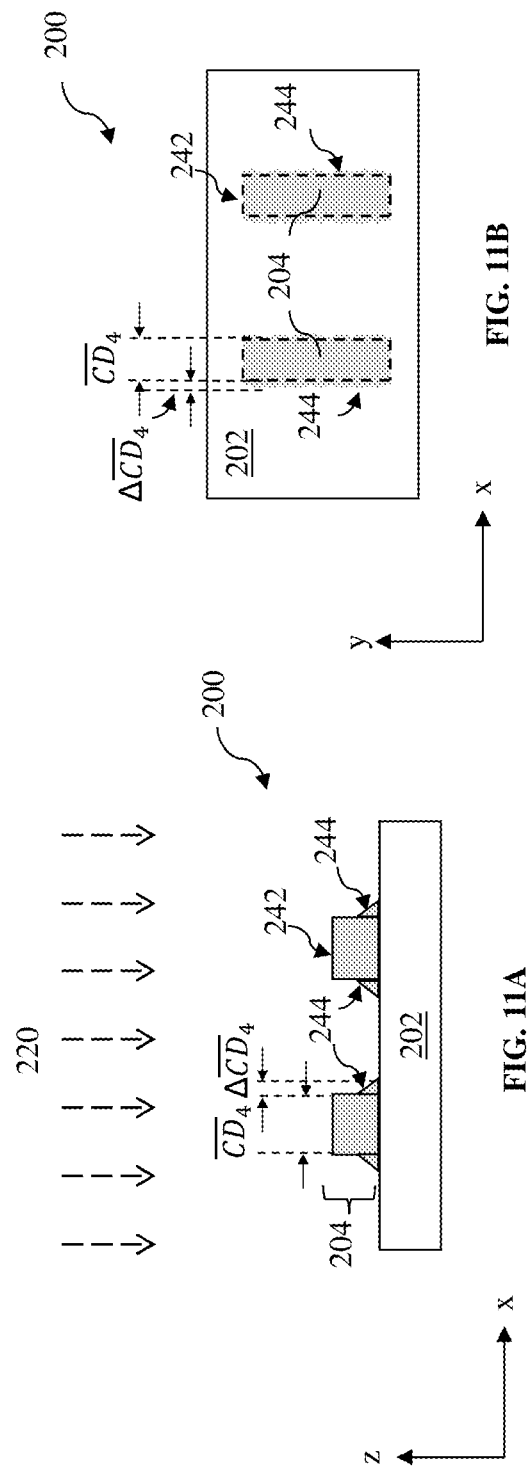

METHODS OF REDUCING PATTERN ROUGHNESS IN SEMICONDUCTOR FABRICATION

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

Line edge roughness (LER) and/or line width roughness (LWR) are commonly formed when patterning line (or trench, contact hole, etc.) features during IC fabrication. They are particularly challenging when critical dimension (CD) of IC devices continue to decrease. LER and/or LWR may arise during exposure and development of resist material (or masking element) and may be transferred though multiple material layers during the patterning process, adversely affecting the final patterning results. Incorporating metal-containing layer(s) has improved etching selectivity during such patterning process; however, improvements in minimizing LER and/or LWR in these layers are still desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 3A, 4A, 5A, 7A, 8A, and 11A are cross-sectional views of an exemplary workpiece during intermediate steps of an example method according to various aspects of the present disclosure.

FIGS. 2B, 3B, 4B, 5B, 7B, 8B, and 11B are corresponding top views of the example workpiece as shown in FIGS. 2A, 3A, 4A, 5A, 7A, 8A, and 11A, respectively.

DETAILED DESCRIPTION

Figure 1A:
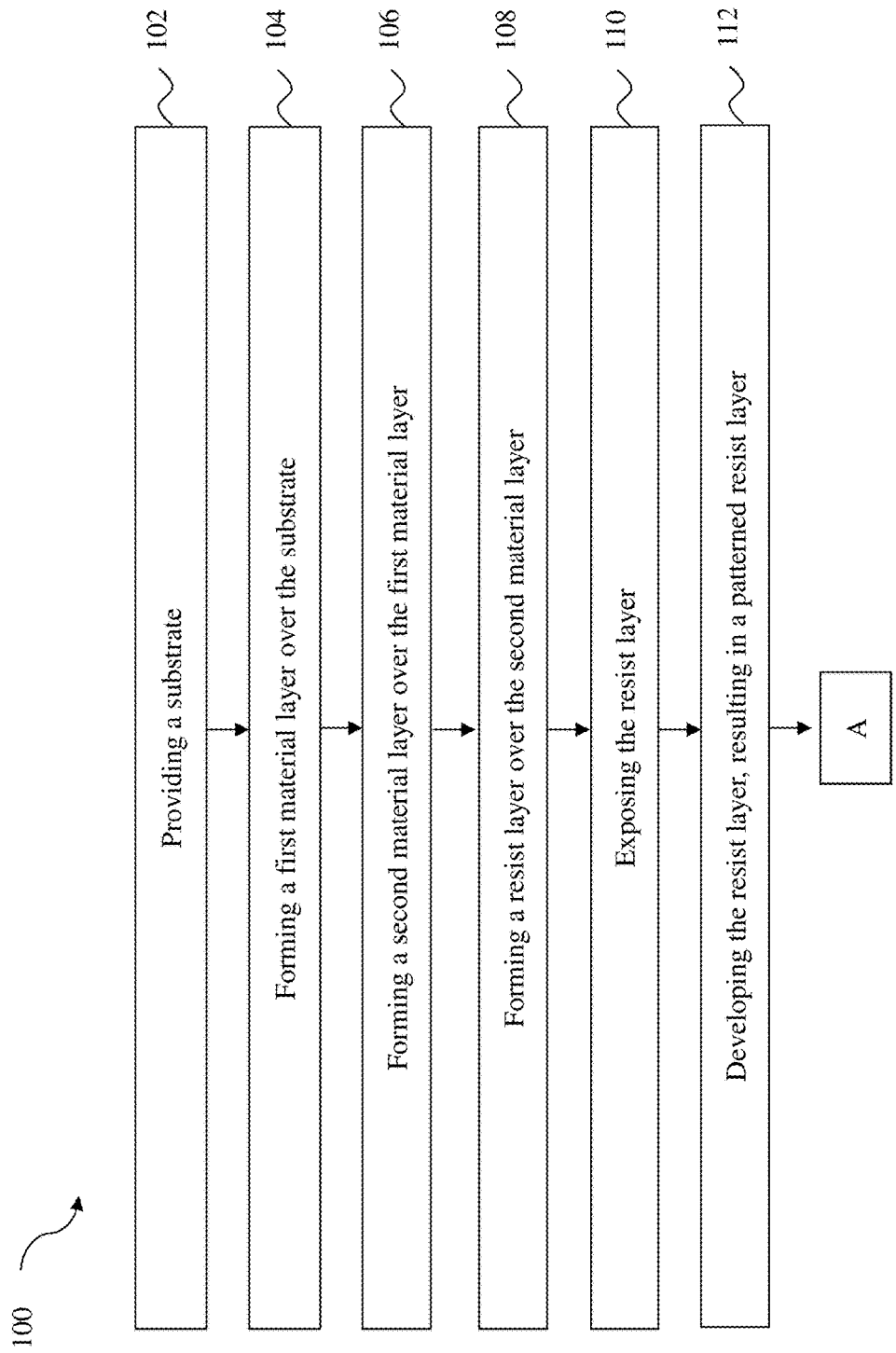
FIGS. 1A and 1B illustrate a flowchart of an exemplary method according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Line edge roughness (LER) and/or line width roughness (LWR), together referred to as roughness of a line (or trench, contact hole, etc.) feature, play an increasingly critical role during IC fabrication. In particular, as critical dimension (CD) of IC features decreases to below 20 nanometers, a ratio of the roughness of the line feature to its CD could determine the resolution of the final pattern formed, and may affect performance of a device formed and/or processed by such a pattern. Therefore, a goal in improving quality of the final pattern is generally two-fold. First, the goal is to ensure that the dimension requirement of IC fabrication is met by keeping the CD of the patterned features substantially constant throughout the patterning process. Second, it is desirable to minimize the roughness of such patterned features at the same time. Incorporating metal-containing material layers has been an adequate strategy for maintaining CD of line features by enhancing etching selectivity with respect to other polymer- or dielectric-based material layers. However, because changes in roughness of a line feature are substantially proportional to changes in CD of the line features, changes in roughness formed during patterning of a resist layer and/or other processes are minimal when etching metal-containing material layers. Accordingly, improvements in method of reducing or minimizing roughness of patterned features in metal-containing material layers are desirable.

Figure 1B:
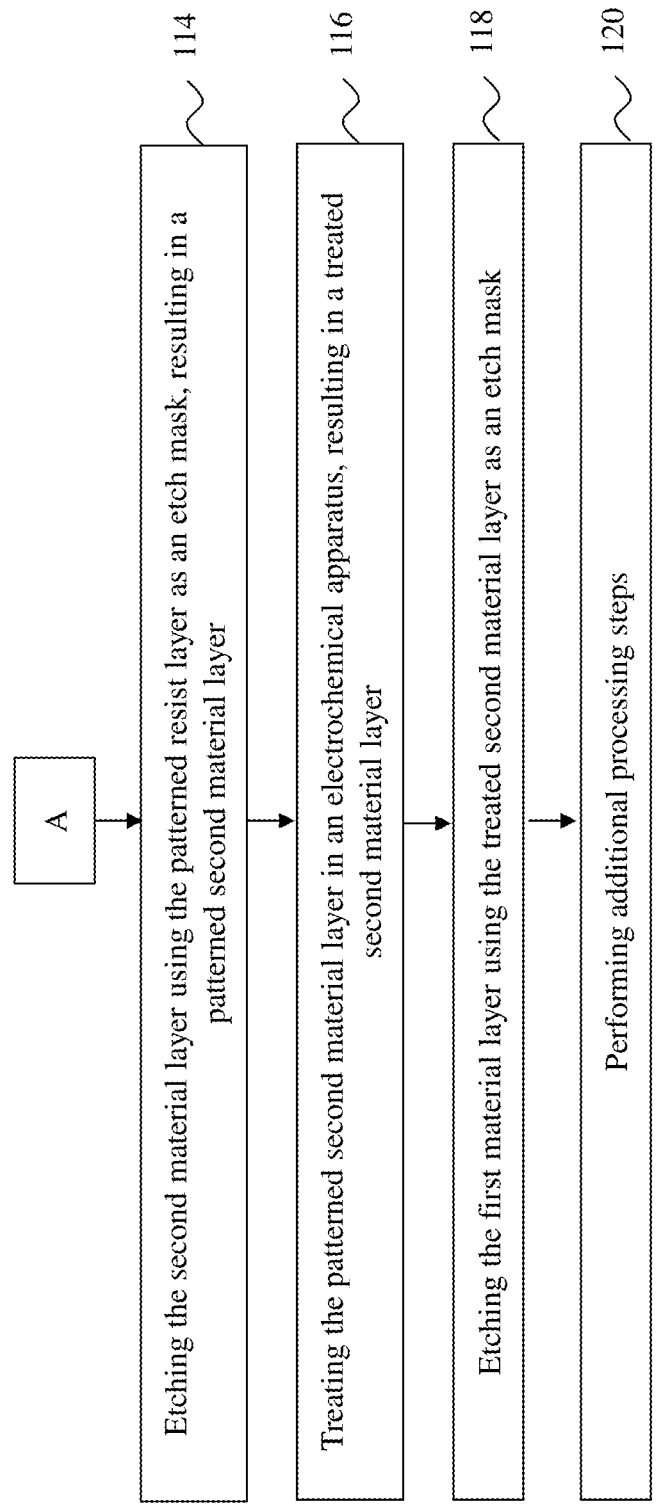

FIGS. 1A and 1B illustrate a flowchart of a method 100 for patterning a workpiece 200 according to some aspects of the present disclosure. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the process. Intermediate steps of the method 100 are described with reference to cross-sectional views of the workpiece 200 as shown in FIGS. 2A, 3A, 4A, 5A, 6B, 6C, 7A, 8A, and 11A, and to corresponding top views of the workpiece 200 as shown in FIGS. 2B, 3B, 4B, 5B, 7B, 8B, and 11B. For clarity and ease of explanation, some elements of the figures have been simplified.

Referring to FIGS. 1A, 2A, and 2B, the method 100 at operation 102 provides (or is provided with) a workpiece 200 including a substrate 202. The substrate 202 may comprise an elementary (single element) semiconductor, such as germanium and/or silicon; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 202 may be a single-layer material having a uniform composition; alternatively, the substrate 202 may include multiple material layers having similar or different compositions suitable for IC device manufacturing. In one example, the substrate 202 may be a silicon-on-insulator (SOI) substrate having a semiconductor silicon layer formed on a silicon oxide layer. In another example, the substrate 202 may include a conductive layer, a semiconductor layer, a dielectric layer, a polymer layer, other layers, and/or combinations thereof. In another example, a top surface of the substrate 202 may include an anti-reflective coating (ARC) whose composition is chosen to minimize reflectivity of a radiation source implemented during exposure of a subsequently-formed resist layer.

The substrate 202 may include various circuit features formed thereon including, for example, field effect transistors (FETs), metal-oxide semiconductor field effect transistors (MOSFETs), CMOS transistors, high voltage transistors, high frequency transistors, bipolar junction transistors, diodes, resistors, capacitors, inductors, varactors, other suitable devices, and/or combinations thereof. In some embodiments where the substrate 202 includes FETs, various doped regions, such as source/drain regions, are formed on the substrate 202. The doped regions may be doped with p-type dopants, such as phosphorus or arsenic, and/or n-type dopants, such as boron or $BF_2$, depending on design requirements. The doped regions may be planar or non-planar (e.g., in a fin-like FET device) and may be formed directly on the substrate, in a P-well structure, in an N-well structure, in a dual-well structure, or using a raised structure. Doped regions may be formed by implantation of dopant atoms, in-situ doped epitaxial growth, and/or other suitable techniques.

Referring to FIGS. 1A, 2A, and 2B, the method 100 at operation 104 forms a layer 204 over the substrate 202. In many embodiments, the layer 204 is substantially free of any metallic element. In the present disclosure, the phrase "substantially free" denotes that a given material layer comprise an element in a concentration no more than what is considered for an impurity, such as, for example, less than about 0.1 atomic percent. Specifically, the metallic element may be in the form of a pure metal, a metal compound (e.g., a metal oxide, a metal nitride, a metal oxynitride, a metal silicide, a metal carbide, etc.), a metal alloy (e.g., a combination of multiple metallic elements), or a combination thereof. In one such example, the layer 204 does not include any metallic element (i.e., the concentration of any metallic element is approximately zero).

The layer 204 may be a single-layer structure or may include a number of layers. In many embodiments, the layer 204 comprises a dielectric material such as a semiconductor oxide, a semiconductor nitride, a semiconductor oxynitride, and/or a semiconductor carbide material. In many embodiments, the layer 204 includes silicon, oxygen, carbon, nitrogen, and/or other suitable elements. In the depicted embodiment, the layer 204 includes a silicon-based material, such as elementary silicon, silicon carbide, silicon nitride, silicon oxycarbide, silicon oxynitride, and/or other suitable silicon-based materials. A composition of the layer 204 is chosen such that the layer 204 can be selectively etched without substantially etching the substrate 202 (or a topmost material layer of the substrate 202). In other words, the layer 204 and the substrate 202 comprise materials having distinct etching sensitivities towards a given etchant. The layer 204 may be formed by any suitable process including chemical vapor deposition (CVD), low-pressure CVD (LPCVD), plasma-enhanced CVD (PECVD), physical vapor deposition (PVD), atomic layer deposition (ALD), spin-on coating, and/or other suitable techniques, and may be formed to any suitable thickness.

Still referring to FIGS. 1A, 2A, and 2B, the method 100 at operation 106 forms a layer 206 over the layer 204. In many embodiments, the layer 206 includes at least one metallic element (thus the layer 206 may be referred to as a metal-containing layer) in the form of a pure metal, a metallic compound (e.g., a metal oxide, a metal nitride, a metal oxynitride, a metal silicide, a metal carbide, etc.), a metal alloy (e.g., a combination of multiple metallic elements), and/or other suitable materials. Non-limiting examples of the metallic element include zirconium (Zr), hafnium (Hf), tin (Sn), lanthanum (La), manganese (Mn), copper (Cu), tantalum (Ta), tungsten (W), aluminum (Al), titanium (Ti), cobalt (Co), and/or other suitable metallic elements. In many embodiments, the layer 206 further includes non-metallic elements such as oxygen, carbon, nitrogen, silicon, and/or other suitable elements. The composition of the layer 206 is chosen such that the layer 206 can be selectively etched without substantially etching the layer 204 (or a topmost material layer of the layer 204). In other words, the layer 206 and the layer 204 comprise materials having distinct etching sensitivities towards a given etchant. In many embodiments, the layer 206 is formed by any suitable process including physical vapor deposition (PVD), chemical vapor deposition (CVD), atomic layer deposition (ALD), low-pressure CVD (LPCVD), plasma-enhanced CVD (PECVD), and/or other suitable techniques, and may be formed to any suitable thickness. In the depicted embodiment, the layer 206 also exhibits a higher etch resistance in comparison to the layer 204. Accordingly, the layer 206 may be formed to a lower thickness than the layer 204. In some embodiments, additional layers may be formed on a top surface of the layer 206.

Referring to FIGS. 1A, 3A, and 3B, the method 100 at operation 108 forms a resist layer 208 over the layer 206. The resist layer 208 may be any lithographically sensitive resist material, and in the depicted embodiment, the resist layer 208 includes a resist material sensitive to radiation (e.g., UV light, deep ultraviolet (DUV) radiation, extreme ultraviolet (EUV) radiation, and/or other radiation sources). However, the principles of the present disclosure apply equally to e-beam resists and other direct-write resist materials. The resist layer 208 may be a single-layer structure or a multi-layer structure. In one embodiment, the resist layer 208 includes a resist material that chemically decomposes (and/or changes polarity) and subsequently becomes soluble in a developer after the resist material is exposed to the radiation. Alternatively, the resist layer 208 includes a resist material that polymerizes (and/or crosslinks) and subsequently becomes insoluble in a developer after the resist material is exposed to the radiation.

In many embodiments, the resist layer 208 comprises a polymer having a backbone (not shown) with a plurality of functional groups (not shown) attached thereto. The polymer backbone may include an acrylate-based polymer, a poly (norbornene)-co-maleic anhydride (COMA) polymer, a poly (hydroxystyrene)-based polymer, and/or other suitable polymers having any number of functional groups that may assist one or more subsequent exposure and developing processes. In some examples, the functional groups may include lithographically sensitive groups (e.g., sensitizers), acid-labile groups (ALGs) configured to be cleavable from the polymer backbone by an acidic moiety generated by a photo-acid generator (PAG) during the exposure process, and/or other suitable functional groups.

In some embodiments, the resist layer 208 may be implemented with a chemical amplification resist (CAR) material by including photosensitive moieties in the resist material's composition. For example, the resist layer 208 includes one or more PAGs that produce acidic moieties during the exposure process. The resist layer 208 may additionally include a photo-decomposable base (PDB), a photo-decomposable quencher (PDQ), a photo-base generator (PBG), and/or other suitable photosensitive moieties. The resist layer 208 may further include a number of additives such as cross-linking agents (e.g., tetramethylol glycoluril linker or epoxy linker), surfactant, chromophores, and/or solvents.

The resist layer 208 may be applied by any suitable technique. In an embodiment, the resist layer 208 is applied in a liquid form using a spin-coating technique. To facilitate application, the resist layer 208 may include a solvent, which when removed, leaves the resist layer 208 in a solid or semisolid form (e.g., a film). The solvent may include propylene glycol methyl ether acetate, propylene glycol monomethyl ether, gamma-butyrolactone, ethyl lactate, cyclohexanone, n-butyl actetate, ethyl ketone, dimethyl formamide, alcohol (e.g., isopropyl alcohol or ethanol), and/or other suitable solvents. The solvent may be driven off as part of the spin-coating process, during a settling process, and/or during a post-application/pre-exposure baking process. The pre-exposure basking process may be implemented by any suitable equipment such as a hotplate, at any temperature suitable for the particular compositions of the resist layer 208 and the solvent employed.

Referring to FIGS. 1A, 4A, and 4B, the method 100 at operation 110 exposes the resist layer 208 to radiation 210. In many embodiments, the radiation 210 may be Mine radiation (wavelength approximately 365 nm), DUV radiation such as KrF excimer laser (wavelength approximately 248 nm) or ArF excimer laser (wavelength approximately 193 nm), EUV radiation (wavelength from about 1 nm to about 100 nm), an X-ray, an e-beam, an ion beam, and/or other suitable radiation. The exposure process at operation 110 may be performed in air, in a liquid (immersion lithography), or in vacuum (e.g., for EUV lithography and e-beam lithography). In the depicted embodiment, the exposure process at operation 110 implements a photolithography technique using a photomask (not shown) that includes a pattern thereon. The photomask may be a transmissive mask or a reflective mask, the latter of which may further implement resolution enhancement techniques such as phase-shifting, off-axis illumination (OAI) and/or optical proximity correction (OPC). In alternative embodiments, the radiation 210 is directly modulated with a predefined pattern, such as an IC layout, without using a photomask (e.g., using a digital pattern generator or direct-write mode). In an embodiment, the radiation 210 is EUV radiation and the exposure process at operation 110 is performed in a EUV lithography system. Correspondingly, a reflective photomask may be used to pattern the resist layer 208.

In the depicted embodiment, regions 208b of the resist layer 208 exposed to the radiation 210 undergo chemical changes (e.g., changes in polarity) while unexposed regions 208a not exposed to the radiation 210 remain substantially unchanged in chemical properties. In some embodiments, the resist material in the exposed regions 208b becomes more polar than the resist material in the unexposed regions 208a. Alternatively, the resist material in the exposed regions 208b may become less polar (i.e., more non-polar) than the resist material in the unexposed regions 208a.

Referring to FIGS. 1A, 5A, and 5B, the method 100 at operation 112 performs a development process on the workpiece 200, resulting in a patterned resist layer 228. The developing process dissolves or otherwise removes either the exposed regions 208b or the unexposed regions 208a, depending upon the chemical reactions undergone in the exposed regions 208b during the exposure process at operation 110 and the polarity of the developer 212 used at operation 112. In the depicted embodiment, the developing process removes the unexposed regions 208a (i.e., a negative-tone development process), though the present disclosure may also implement a positive-tone development process. The developing process at operation 112 may begin with a post-exposure baking process. Depending on the polymer(s) included in the resist layer 208, the post-exposure baking process may catalyze any chemical reaction initiated by the exposure process at operation 110. Following the optional post-exposure baking process, the developer 212 is applied to the workpiece 200, thereby removing the unexposed regions 208a of the resist layer 208, resulting in the patterned resist layer 228 comprising the exposed regions 208b. If the exposed regions 208b become more polar compared to the unexposed regions 208a during the exposure process at operation 110, a non-polar developer may be used to remove the unexposed regions 208a. Suitable non-polar developers include n-butyl acetate, ethanol, hexane, benzene, toluene, and/or other suitable solvents. Alternatively, if the exposed regions 208b become less polar (i.e., more non-polar) compared to the unexposed regions 208a during the exposure process at operation 110, a polar developer may be used to remove the unexposed regions 208a. Suitable polar developers include tetramethyl ammonium hydroxide (TMAH), KOH, NaOH, and/or other suitable solvents.

Figure 6B:
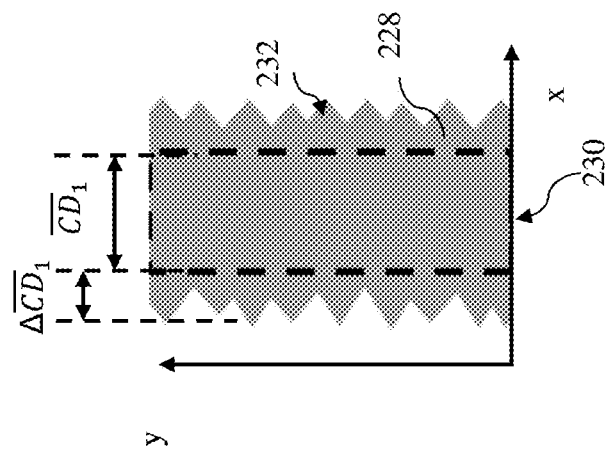
FIGS. 6B, 6C, 6D are enlarged top views of the example workpiece as shown in FIGS. 5B, 7B, and 8B.
Figure 6A:
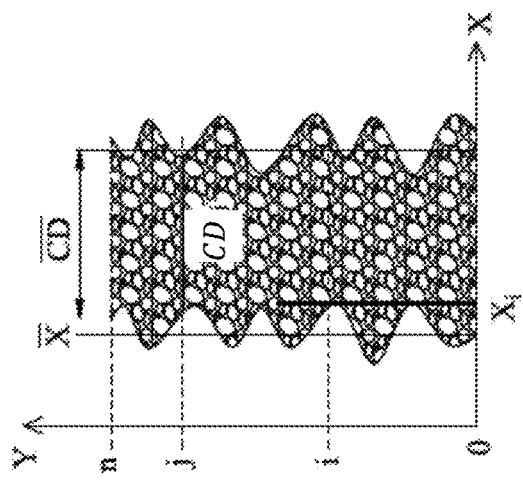
FIG. 6A is a top view of an example workpiece according to various aspects of the present disclosure.

As depicted in FIGS. 5A and 5B, the patterned resist layer 228 includes two line patterns 230 oriented length-wise in the y direction and roughness features 232 disposed on sidewall surfaces of each line pattern 230 in the y direction. In some embodiments, roughness features are additionally or alternatively present at edges oriented in the x direction, and embodiments of the present disclosure are applicable to such features as well. Furthermore, although line patterns are shown in the depicted embodiment, embodiments of the present disclosure are also applicable to other patterns such as trenches or contact holes. The line patterns 230 and the roughness features 232 will be discussed in detail below with reference to FIGS. 6A and 6B.

Due to poor resist contrast, swelling or contraction of the resist material, and/or other defects formed during the exposure and/or development processes discussed above, line patterns (such as the line pattern 230) often develop roughness along their edges (such as the roughness features 232). Such roughness, unless promptly treated, are transferred to underlying material layer(s) during subsequent processing steps (such as etching) and adversely affect dimensions of final device features thus formed. The present disclosure provides methods of treating and reducing (or minimizing) roughness associated with line patterns at a subsequent etching process in an effort to ensure that final device features retain their dimensions desired for IC fabrication.

In the present disclosure, roughness of line patterns may be described by parameters such as line edge roughness (LER) and/or line width roughness (LWR). LER generally describes statistical variations of a line pattern averaged along its edges, while LWR generally describes statistical variations of a line pattern's widths averaged over its length. In many instances, LWR is mathematically related to LER for a given pattern. Specifically, referring to FIG. 6A, for a line pattern substantially elongated along the y direction and having a width CD, LER is defined as a $3\sigma$ deviation of a distance in the x direction between position $x_i$ located at an edge of the width CD of the line pattern and position $\bar{x}$ (a line fit drawn through the roughness of the line pattern), or mathematically, $$LER = \sqrt[3]{\sum_{i=0}^{n}(x_i - \bar{x})^2/n}$$

LWR, on the other hand, is defined as a $3\sigma$ deviation of the width CD along the line pattern in the y direction, or mathematically, $$LWR = \sqrt[3]{\sum_{j=0}^{n}(CD_j - \overline{CD})^2/n},$$

where CD is the width CD averaged over the length of the line pattern in the y direction. Here, n represents the number of increments over which the LER and the LWR are averaged, and i and j each represents a specific increment along the y direction. In the depicted embodiment, referring to FIG. 6B, the line pattern 230 may be described by an average critical dimension $\overline{CD}_1$, which generally reflects a width $CD_1$ of the line pattern 230 averaged over a length of the line pattern 230 in the y direction. At any given increment along the y direction, the roughness features 232 may be described by an average width $\Delta\overline{CD}_1$, where $\Delta\overline{CD}_1 = |CD_1 - \overline{CD}_1|$, which is captured in the LWR equation above. In some embodiments, a ratio of $\Delta\overline{CD}_1$ to $\overline{CD}_1$ is about 1:10 to about 1:3.

Figure 7A:
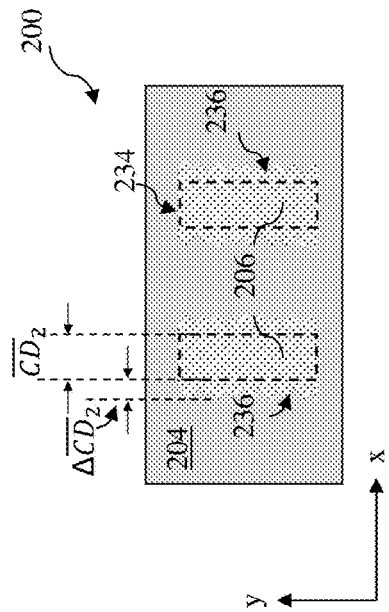
Figure 7B:
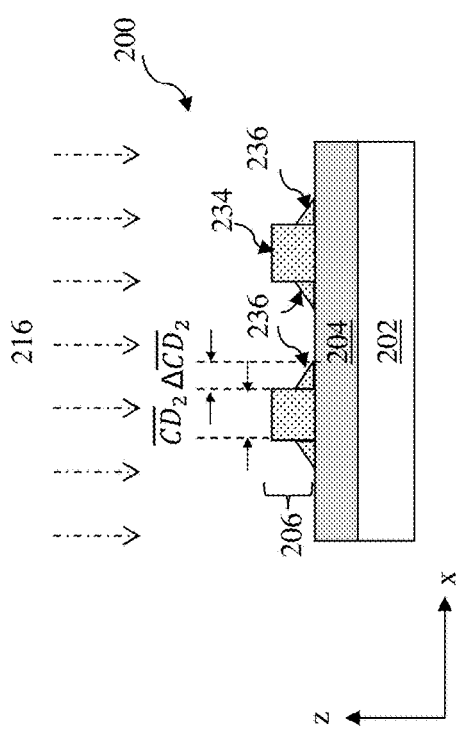

Referring to FIGS. 1B, 7A, and 7B, the method 100 at operation 114 selectively removes portions of the layer 206 using the patterned resist layer 228 as the etch mask, resulting in a patterned layer 206. Specifically, the layer 206 may be etched using any suitable method including a dry etching process, a wet etching process, a reactive ion etching (RIE) process, other suitable etching process, or combinations thereof. In an embodiment, a dry etching process is implemented and employs an etchant gas 216 that includes chlorine-containing gas (e.g., $Cl_2$, $C_xH_yCl_z$, $C_xCl_y$, $Si_xCl_y$, and/or $B_xCl_y$, where x, y, and z may be any integers), a bromine-containing gas (e.g., HBr and/or $C_xH_yBr_z$), a nitrogen-containing gas (e.g., $N_2$), a hydrogen-containing gas (e.g., $H_2$), an iodine-containing gas, and/or other suitable gases or plasmas. Thereafter, the patterned resist layer 228 is removed by any suitable method, such as resist stripping or plasma ashing.

Figure 6D:
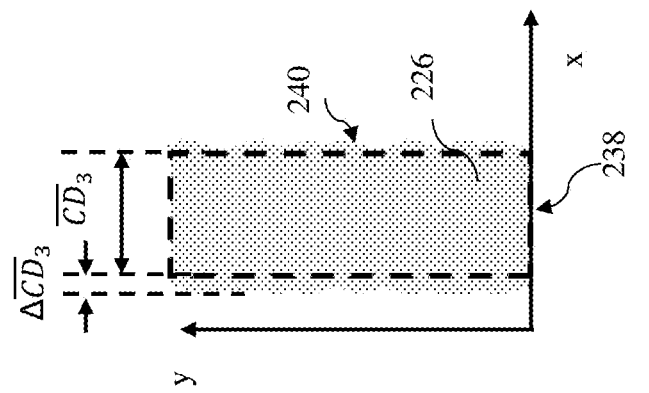
Figure 6C:
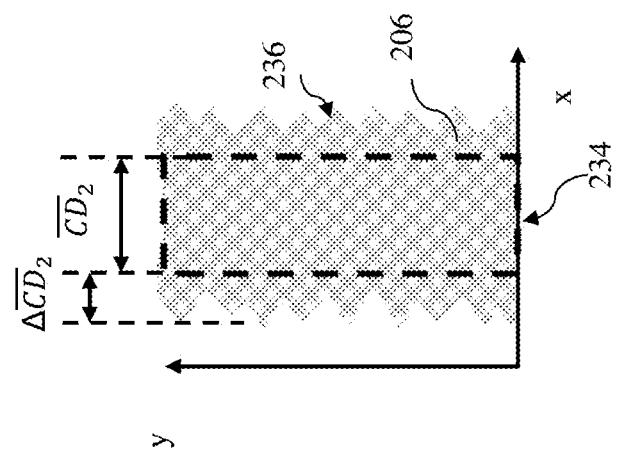

As depicted in FIGS. 6C, 7A, 7B, the patterned layer 206 includes line features 234 that may be described by an average line width $\overline{CD}_2$ and roughness features 236 that may be described by an average width $\Delta\overline{CD}_2$, where $\overline{CD}_2$ and $\Delta\overline{CD}_2$ are each defined similarly to $\overline{CD}_1$ and $\Delta\overline{CD}_1$, respectively, as discussed above in reference to FIGS. 6A and 6B. In many embodiments, the average line width $\overline{CD}_2$ of the line feature 234 in the patterned layer 206 is quantitatively similar to the average line width $\overline{CD}_1$ of the line pattern 230 in the patterned resist layer 228, and the averaged width $\Delta\overline{CD}_2$ of the roughness features 236 in the patterned layer 206 is quantitatively similar to the width $\Delta\overline{CD}_1$ of the roughness features 232 in the patterned resist layer 228. This may be a result of the layer 206, a metal-containing layer, exhibiting adequate etching resistance against the dry etchant(s) applied at operation 114, such that the average width of the line pattern 230 as well as the average width of the roughness features 232 are both preserved during the etching process. As a result, in many embodiments, a ratio of $\Delta\overline{CD}_2$ to $\overline{CD}_2$ is similar to the ratio of $\Delta\overline{CD}_1$ to $\overline{CD}_1$, which is about 1:10 to about 1:3.

Figure 8A:
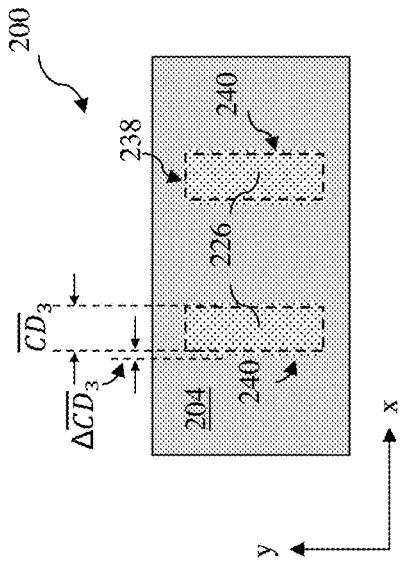
Figure 8B:
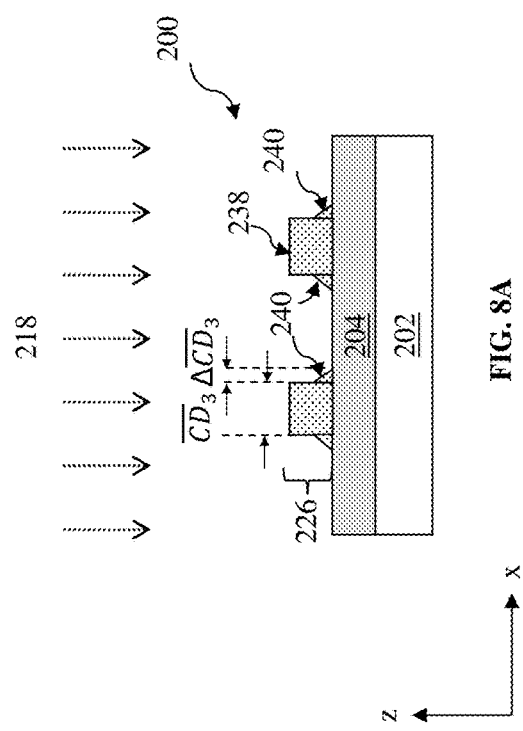

Referring to FIGS. 1B, 8A, and 8B, the method 100 at operation 116 performs an electrochemical treatment 218 to the patterned layer 206, resulting in a treated layer 226. In the depicted embodiment, the method 100 does so by performing an electrochemical treatment 218 to the patterned layer 206. The treated layer 226 includes line features 238 that may be described by an average line width $\overline{CD}_3$ and roughness features 240 that may be described by an average width $\Delta\overline{CD}_3$, where $\overline{CD}_3$ and $\Delta\overline{CD}_3$ are each defined similarly to $\overline{CD}_1$ and $\Delta\overline{CD}_1$, respectively, as discussed above in reference to FIGS. 6A and 6B. In many embodiments, referring to FIG. 6D, the average line width $\overline{CD}_3$ of the line features 238 in the treated layer 226 is quantitatively similar to the average line width $\overline{CD}_2$ of the line features 234 in patterned layer 206, while the averaged width $\Delta\overline{CD}_3$ of the roughness features 240 in the treated layer 226 is reduced such that a ratio of $\Delta\overline{CD}_3$ to $\overline{CD}_3$ in the treated layer 226, which is reflective of the roughness of the line features 238, is about 30% to about 70% of the ratio of $\Delta\overline{CD}_2$ to $\overline{CD}_2$ in the patterned layer 206, which is reflective of the roughness of the line features 234. Accordingly, the method 100 at operation 116 provides an overall reduction in the LER and/or LWR of the line features 238 formed in the patterned layer 206.

Figure 9:
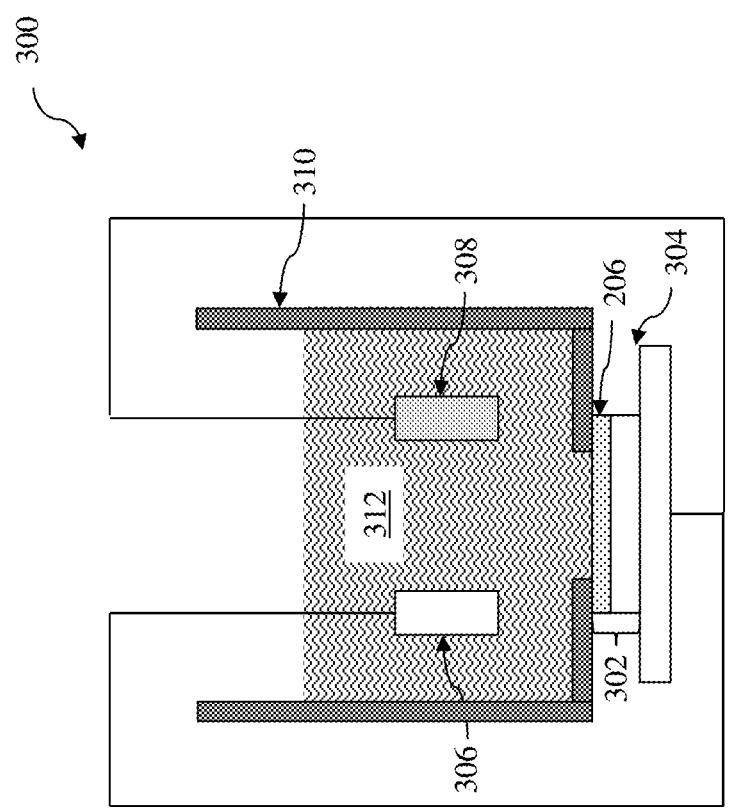
FIG. 9 is a cross-sectional view of an example apparatus according to various aspects of the present disclosure.

In the depicted embodiment, referring to FIG. 9, the method 100 provides an apparatus 300 configured to perform the electrochemical treatment 218 at operation 116. In the present embodiment, the apparatus 300 is a three-electrode electrochemical cell configured to implement reduction-oxidation reactions to the workpiece 200; however, the present embodiment may also be implemented using other systems, such as a two-electrode cell that includes a working electrode and a counter electrode. The apparatus 300 includes a working electrode 302, a counter electrode 306 configured to supply and/or monitor a current applied to the working electrode 302, and a reference electrode 308 configured to monitor a voltage applied to the working electrode 302. In the present disclosure, the workpiece 200 that includes the patterned layer 206 acts as the working electrode 302. In the depicted embodiment, the counter electrode 306 includes platinum, and the reference electrode 308 includes copper/copper fluoride (Cu/CuF); however, other suitable materials may also be used for the counter electrode 306 and the reference electrode 308, respectively. The working electrode 302 (i.e., the workpiece 200) is disposed on and in physical contact with a back contact plate 304, which electrically connects the working electrode 302 to the counter electrode 306 and the reference electrode 308, respectively. The counter electrode 306 and the reference electrode 308 are fully immersed in a conductive solution 312 (such as an electrolyte dissolved in a solvent described in detail below) contained in a reaction chamber 310, while the working electrode 302 including the patterned layer 206 is exposed to the conductive solution 312. The apparatus 300 may include numerous additional components configured to facilitate and/or monitor the reduction-oxidation reactions occurring on the workpiece 200.

Figure 10A:
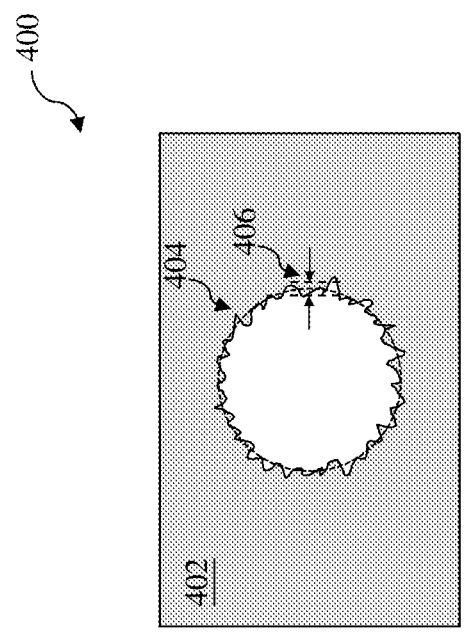
FIGS. 10A and 10B are top views of an example workpiece according to various aspects of the present disclosure.
Figure 10B:
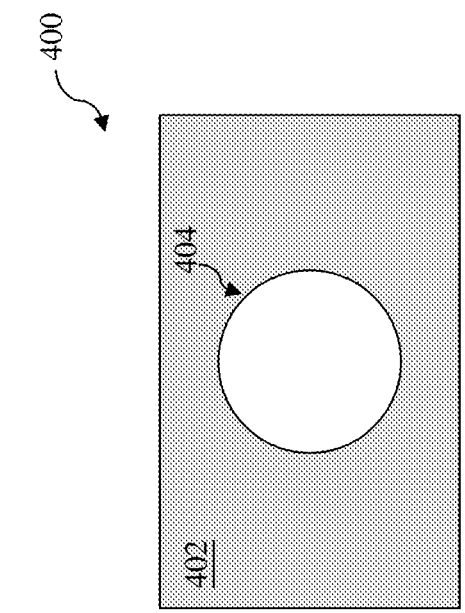

When a negative potential (in V) is applied to the working electrode 302 relative to the counter electrode 306 (i.e., the working electrode 302 has a lower potential than the counter electrode 306), metal-containing material on the edges of the patterned layer 206 (i.e., in the roughness features 236) exposed to the conductive solution 312 undergo oxidation reaction. As a result, portions of the roughness features 236 are dissolved in the conductive solution 312 in the form of metallic ions. When a positive potential is subsequently applied to the working electrode 302 relative to the counter electrode 306 (i.e., the working electrode 302 has a higher potential than the counter electrode 306), the metallic ions dissolved in the conductive solution 312 are reduced and thus re-deposited onto the roughness features 236, though the extent of the re-deposition is not necessarily the same as the extent of the loss. In the depicted embodiment, the negative potential and positive potential are applied in an alternating fashion. In some embodiments, the magnitude of the negative potential is about the same as the magnitude of the positive potential (such as, for example, about 3 V), though the present embodiments are not hereby limited. In many embodiments, the magnitude of the negative and/or positive potential is determined by the type of metallic element(s) included in the patterned layer 206, such as according to the metallic element's range of reductive potential. In the present disclosure, the negative potential may be less than about 0 V and greater than about −3 V, and the positive potential is more than about 0 V and less than about 3 V. Of course, other ranges of potential may also be applicable to the present disclosure. In other words, the magnitude of the negative and the positive potential ranges from about 0 V to about 3V. By controlling the magnitude of the applied potential (measured, for example, against the reference electrode 308), a frequency at which a negative potential is switched to a positive potential (and vice versa), the magnitude of current passing between the working electrode 302 and the counter electrode 306, and/or other suitable parameters, the extent of the loss and re-deposition of the metal-containing material in the roughness features 236 can be tuned such that the average width $\Delta\overline{CD}_2$ of the roughness features 236 is reduced. For embodiments in which a contact holes are patterned, applying the electrochemical treatment 218 in the apparatus 300 similarly smoothes roughness along its edge, such that a circularity of the contact hole, defined as three sigma of the diameter of the contact hole, may be improved. FIGS. 10A and 10B illustrate an example workpiece 400 that includes such a contact hole 404. Referring to FIG. 10A, the contact hole 404, when viewed from a top view, is formed in a dielectric layer (e.g., an interlayer dielectric (ILD) layer) 402 and has an average roughness 406 along its edge. After applying the electrochemical treatment 218 in the apparatus 300, referring to FIG. 10B, the average roughness 406 is reduced in a manner similar to that discussed above with respect to the roughness features 236, thus improving the circularity of the contact hole 404.

In some embodiments, the frequency of potential switching ranges from about 0.1 Hz to about 1000 Hz, the current less than about 1 A, and the temperature of the conductive solution 312 ranges from about 10 degrees Celsius to about 200 degrees Celsius. In an example embodiment, the current ranges from about 1 mA to about 100 mA. In another example embodiment, the temperature of the conductive solution 312 ranges from about 10 degrees Celsius to about 45 degrees Celsius. The current being less about 1 A helps facilitate the rate of the electrochemical reaction. In many embodiments, the conductive solution 312 includes an electrolyte dissolved in a solvent and has a pH of about 4 to about 11. The electrolyte may be an ionic compound such as HCl, $NH_3$, $HClO_4$, $H_2SO_4$, $H_2SO_3$, $H_3PO_4$, $H_3NO_4$, $CH_3COOH$, $NH_4OH$, and/other ionic compounds. In an embodiment, the electrolyte has an ionicity of at least 10%, which is the extent of which an ionic compound dissociates in a solvent. The solvent includes a polar solvent, such as water (e.g., deionized water), an alcohol (e.g., ethanol, methanol, other suitable alcohols, or combinations thereof). In the depicted embodiment, the solvent includes at least 70% of water by weight. In some embodiments, a surfactant is included in the polar solvent. In such an example, the surfactant includes a non-ionic compound.

Thereafter, referring to FIGS. 1B, 11A, and 11B, the method 100 at operation 118 patterns the layer 204 using the treated layer 226 as an etch mask. Specifically, the layer 204 may be etched using any suitable method including a dry etching process, a wet etching process, other suitable etching process, an RIE process, or combinations thereof. In an embodiment, a dry etching process is implemented and employs an etchant gas 220 that includes an oxygen-containing gas (e.g., $O_2$), a carbon-containing gas (e.g., $C_xH_y$, where x and y may be any integers), a fluorine-containing etchant gas (e.g., $C_xF_y$, $C_xH_yF_z$, $N_xF_y$, and/or $S_xF_y$, where x, y, and z may be any integers), and/or other suitable etchant gases. Thereafter, the treated layer 226 is removed by any suitable method such as plasma ashing or flushing.

Due to differences in material compositions between the layer 204 and the layer 206 (thus displaying etching selectivity between the two), dimensions of the line features 238 and the roughness features 240 formed in the treated layer 226 are transferred by the etching process to the patterned layer 204 at operation 118. Correspondingly, an average line width $\overline{CD}_4$ of the line feature 242 in the patterned layer 204 is quantitatively similar to the average line width $\overline{CD}_3$ of the line features 238 in the treated layer 226, and the averaged width $\Delta\overline{CD}_4$ of the roughness features 244 in the patterned layer 204 is quantitatively similar to the width $\Delta\overline{CD}_3$ of the roughness features 240 in the treated layer 226. As a result, in many embodiments, a ratio of $\Delta\overline{CD}_4$ to $\overline{CD}_4$ is about 30% to about 70% of the ratio of $\Delta\overline{CD}_2$ to $\overline{CD}_2$ in the patterned layer 206.

Thereafter, referring FIG. 1B, the method 100 at operation 120 performs additional processing steps to the workpiece 200. In many embodiments, the method 100 at operation 120 processes the substrate 202 using the patterned layer 204 as a mask. After the substrate 202 is processed, the patterned layer 204 is removed using any suitable method, such as plasma ashing or flushing. Any suitable method may be performed to process the substrate 202 including an etching process, a deposition process, an implantation process, an epitaxial growth process, and/or any other fabrication process. In various examples, the processed substrate 202 is used to fabricate a gate stack, to fabricate an interconnect structure, to form non-planar devices by etching to expose a fin or by epitaxially growing fin material, and/or other suitable applications. Thereafter, the workpiece 200 may then be provided for other fabrication processes. For example, the workpiece 200 may be used to fabricate an integrated circuit chip, a system-on-a-chip (SOC), and/or a portion thereof, and thus the subsequent fabrication processes may form various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, other types of transistors, and/or other circuit elements. Alternatively, the processed substrate 202 may be sued to form a photomask, such as a transmissive mask or a reflective mask configured for various photolithography patterning processes.

The present disclosure provides methods of reducing edge and/or width roughness (e.g., LER and/or LWR) of line (or trench, contact hole, etc.) features formed in a metal-containing material layer during patterning process. In particular, after transferring a line pattern to the metal-containing material layer formed over a substrate of an IC device, a resulting LER and/or LWR of the line pattern may be reduced by electrochemically treating the metal-containing material layer in, for example, a three-electrode cell. The electrochemical treatment includes exposing the metal-containing material layer to a conductive solution and applying a potential to the metal-containing material layer and a counter electrode. Metallic element(s) included in the metal-containing material layer undergo alternating oxidation and reduction reactions, such that roughness present at edges of the line pattern may be smoothed.

Although not intended to be limiting, one or more embodiments of the present disclosure provide many benefits to a semiconductor device and a formation process thereof. It is understood, however, that other embodiments may offer additional advantages, and not all advantages are necessarily disclosed herein, and that no particular advantage is required for all embodiments. For example, methods of electrochemically treating patterned features formed in metal-containing material layer(s) help reduce (or minimize) feature roughness while maintaining CD of the patterned features during an IC patterning process.

In one aspect, the present disclosure provides a method that includes forming a material layer over a substrate, patterning the material layer to form a patterned material layer, and treating the patterned material layer to reduce a roughness of the first roughness feature, thereby forming a second pattern that includes the line feature and a second roughness feature. In some embodiments, the material layer includes a metallic compound. In some embodiments, the patterned material layer includes a first pattern, the first pattern including a line feature and a first roughness feature disposed on an edge of the line feature. In some embodiments, the treating of the patterned material layer includes applying a potential to the patterned material layer exposed in an electrically conducting solution.

In some embodiments, the electrically conducting solution includes an electrolyte and a polar solvent. In some embodiments, the metallic compound includes Zr, Sn, Hf, or combinations thereof.

In some embodiments, a first roughness is a ratio of a width of the first roughness feature to a width of the line feature and a second roughness is a ratio of a width of the second roughness feature to the width of the line feature. In further embodiments, the second roughness is about 30% to about 70% of the first roughness.

In some embodiments, the applying the potential includes applying the potential between the patterned material layer and a counter electrode exposed in the electrically conducting solution. In further embodiments, the applying the potential includes alternately applying a negative potential and a positive potential to the patterned material layer relative to the counter electrode. In still further embodiments, the applying the negative potential and the positive potential results in an oxidation reaction and a reduction reaction, respectively, to the metallic compound included in the first roughness feature.

In another aspect, the present disclosure provides a method that includes forming a metal-containing layer over a substrate, forming a resist layer over the metal-containing layer, exposing the resist layer, developing the exposed resist layer to form a patterned resist layer, etching the metal-containing layer using the patterned resist layer as a mask, thereby forming a patterned metal-containing layer, and treating the patterned metal-containing layer. In some embodiments, the treating of the patterned metal-containing layer includes applying a potential to the patterned metal-containing layer while the patterned metal-containing layer is exposed to a conductive solution.

In some embodiments, the patterned metal-containing layer includes a line feature, and the treating the patterned metal-containing layer reduces a line edge roughness (LER) or a line width roughness (LWR) of the line feature. In some embodiments, the patterned metal-containing layer includes a contact hole feature, and the treating the patterned metal-containing layer improves a circularity of the contact hole feature.

In some embodiments, the conductive solution includes an electrolyte, and the electrolyte includes HCl, $NH_3$, $HClO_4$, $H_2SO_4$, $H_2SO_3$, $H_3PO_4$, $H_3NO_4$, $CH_3COOH$, $NH_4OH$, or combinations thereof. In some embodiments, the conductive solution further includes a non-ionic surfactant.

In some embodiments, the patterned metal-containing layer is a working electrode in a three-electrode electrochemical cell, such that the applying the potential to the patterned metal-containing layer includes alternating application of a negative potential and a positive potential to the working electrode relative to a counter electrode exposed to the conductive solution. In further embodiments, the application of the negative potential dissolves portions of the patterned metal-containing layer, and the application of the positive potential re-deposits the dissolved portions on the patterned metal-containing layer. In some embodiments, a magnitude of the negative potential and the positive potential is from about 0 V to about 3 V.

In yet another aspect, the present disclosure provides a method that includes forming a first material layer over a substrate, forming a second material layer over the first material layer, patterning the second material layer to form a line having a first roughness feature, treating the patterned second material layer with an electrochemical treatment, thereby forming a treated second material layer, and etching the first material layer using the treated second material layer as a mask. In some embodiments, the second material layer is a metal-containing layer. In some embodiments, the first roughness feature has a first width, and the treated second material layer having a second roughness feature, where the second roughness feature has a second width that is less than the first width. In some embodiments, the first material layer is a silicon-based material layer.

In some embodiments, the treating the patterned second material layer includes exposing the patterned second material layer to an electrically conducting solution, and alternately applying a negative potential and a positive potential to the patterned second material layer relative to a counter electrode exposed to the electrically conducting solution. In some embodiments, the electrically conducting solution includes an ionic compound dissolved in water. In some embodiments, a magnitude of the negative potential is the same as a magnitude of the positive potential.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a material layer over a substrate, wherein the material layer includes a metallic compound;
   patterning the material layer, resulting in patterned material layer, wherein the patterned material layer includes a first pattern, the first pattern including a line feature and a first roughness feature disposed on an edge of the line feature; and
   treating the patterned material layer to reduce a roughness of the first roughness feature, thereby forming a second pattern that includes the line feature and a second roughness feature, wherein the treating includes applying a potential to the patterned material layer exposed in an electrically conducting solution.

2. The method of claim 1, wherein the electrically conducting solution includes an electrolyte and a polar solvent.

3. The method of claim 1, wherein the metallic compound includes Zr, Sn, Hf, or combinations thereof.

4. The method of claim 1, wherein a first roughness is a ratio of a width of the first roughness feature to a width of the line feature and a second roughness is a ratio of a width of the second roughness feature to the width of the line feature.

5. The method of claim 4, wherein the second roughness is about 30% to about 70% of the first roughness.

6. The method of claim 1, wherein the applying the potential includes applying the potential between the patterned material layer and a counter electrode exposed in the electrically conducting solution.

7. The method of claim 6, wherein the applying the potential includes alternately applying a negative potential and a positive potential to the patterned material layer relative to the counter electrode.

8. The method of claim 7, wherein the applying the negative potential and the positive potential results in an oxidation reaction and a reduction reaction, respectively, to the metallic compound included in the first roughness feature.

9. A method, comprising:
   forming a metal-containing layer over a substrate;
   forming a resist layer over the metal-containing layer;
   exposing the resist layer;
   developing the exposed resist layer to form a patterned resist layer;
   etching the metal-containing layer using the patterned resist layer as a mask, thereby forming a patterned metal-containing layer; and
   treating the patterned metal-containing layer, wherein the treating includes applying a potential to the patterned metal-containing layer while the patterned metal-containing layer is exposed to a conductive solution.

10. The method of claim 9, wherein the patterned metal-containing layer includes a line feature, and wherein the treating the patterned metal-containing layer reduces a line edge roughness (LER) or a line width roughness (LWR) of the line feature.

11. The method of claim 9, wherein the patterned metal-containing layer includes a contact hole feature, and wherein the treating the patterned metal-containing layer improves a circularity of the contact hole feature.

12. The method of claim 9, wherein the conductive solution includes an electrolyte, the electrolyte including $HCl$, $NH_3$, $HClO_4$, $H_2SO_4$, $H_2SO_3$, $H_3PO_4$, $H_3NO_4$, $CH_3COOH$, $NH_4OH$, combinations thereof.

13. The method of claim 12, wherein the conductive solution further includes a non-ionic surfactant.

14. The method of claim 9, the patterned metal-containing layer being a working electrode in a three-electrode electrochemical cell, wherein the applying the potential to the patterned metal-containing layer includes alternating application of a negative potential and a positive potential to the working electrode relative to a counter electrode exposed to the conductive solution.

15. The method of claim 14, wherein the application of the negative potential dissolves portions of the patterned metal-containing layer, and wherein the application of the positive potential re-deposits the dissolved portions on the patterned metal-containing layer.

16. The method of claim 14, wherein a magnitude of the negative potential and the positive potential is from about 0 V to about 3 V.

17. A method, comprising:
   forming a first material layer over a substrate;
   forming a second material layer over the first material layer, wherein the second material layer is a metal-containing layer;
   patterning the second material layer to form a line having a first roughness feature, wherein the first roughness feature has a first width;
   treating the patterned second material layer with an electrochemical treatment, thereby forming a treated second material layer, the treated second material layer having a second roughness feature, wherein the second roughness feature has a second width that is less than the first width; and
   etching the first material layer using the treated second material layer as a mask.

18. The method of claim 17, wherein the first material layer is a silicon-based material layer.

19. The method of claim 17, wherein the treating the patterned second material layer includes:

exposing the patterned second material layer to an electrically conducting solution, the electrically conducting solution including an ionic compound dissolved in water; and alternately applying a negative potential and a positive potential to the patterned second material layer relative to a counter electrode exposed to the electrically conducting solution.

20. The method of claim 19, wherein a magnitude of the negative potential is the same as a magnitude of the positive potential.

\* \* \* \* \*